(12) United States Patent
Xi et al.

(10) Patent No.: US 7,760,542 B2
(45) Date of Patent: Jul. 20, 2010

(54) SPIN-TORQUE MEMORY WITH UNIDIRECTIONAL WRITE SCHEME

(75) Inventors: Haiwen Xi, Prior Lake, MN (US); Dexin Wang, Eden Prairie, MN (US); Dimitar V. Dimitrov, Edina, MN (US); Paul E. Anderson, Eden Prairie, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 323 days.

(21) Appl. No.: 12/106,382

(22) Filed: Apr. 21, 2008

(65) Prior Publication Data
US 2009/0262638 A1    Oct. 22, 2009

(51) Int. Cl.
*G11C 11/00* (2006.01)

(52) U.S. Cl. .................. 365/158; 365/173; 257/421

(58) Field of Classification Search .......... 365/158, 365/173; 257/421
See application file for complete search history.

(56) References Cited

U.S. PATENT DOCUMENTS

| | | | |
|---|---|---|---|
| 6,714,444 B2 | 3/2004 | Huai et al. | |
| 7,369,427 B2 | 5/2008 | Diao | |
| 7,489,541 B2 | 2/2009 | Pakala | |
| 7,502,249 B1 | 3/2009 | Ding | |
| 2006/0018057 A1* | 1/2006 | Huai | 360/324.2 |
| 2007/0246787 A1 | 10/2007 | Wang et al. | |
| 2009/0050991 A1 | 2/2009 | Nagai | |
| 2009/0302403 A1 | 12/2009 | Nguyen | |

OTHER PUBLICATIONS

Ozatay et al., Spin Transfer by Nonuniform Current Injection Into a Nanomagnet, Applied Physics Letters 88, 202502 (2006).
Kawahara et al., Spin-Transfer Torque RAM (SPRAM) with Bit-by-Bit Bidirectional Current Write and Parallelizing-Direction Current Read, ISSCC 07, San Francisco, Feb. 2007.
Slonczewski, J.C., Current-Driven Excitation of Magnetic Multilayers, Journal of Magnetism and Magnetic Materials 159 (1996) L1-L7.
Waintal, et al., Role of Spin-Dependent Interface Scattering in Generating Current-Induced Torques in Magnetic Multilayers, Phy. Rev. B, vol. 62, 12317 (2000).

* cited by examiner

*Primary Examiner*—Hoai V Ho
(74) *Attorney, Agent, or Firm*—Campbell Nelson Whipps LLC

(57) ABSTRACT

Spin torque magnetic memory elements that have a pinned layer, two free layers, and a current-blocking insulating layer proximate to at least one of the free layers. The resistive state (e.g., low resistance or high resistance) of the memory elements is altered by passing electric current through the element in one direction. In other words, to change from a low resistance to a high resistance, the direction of electric current is the same as to change from a high resistance to a low resistance. The elements have a unidirectional write scheme.

22 Claims, 4 Drawing Sheets

SPIN-TORQUE MEMORY WITH UNIDIRECTIONAL WRITE SCHEME

BACKGROUND

Spin electronics combine semiconductor technology and magnetics, and is a more recent development in memory devices, e.g., MRAM devices. In spin electronics, the spin of an electron, rather than the charge, is used to indicate the presence of digital information. The digital information or data, represented as a "0" or "1", is storable in the alignment of magnetic moments within a magnetic element. The resistance of the magnetic element depends on the moment's alignment or orientation. The stored state is read from the element by detecting the component's resistive state.

The magnetic element, in general, includes a pinned layer and a free layer, each having a magnetization orientation. The magnetization orientations of the free layer and the pinned layer, define the resistance of the overall magnetic element. When the magnetization orientations of the free layer and pinned layer are parallel, the resistance of the element is low. When the magnetization orientations of the free layer and the pinned layer are antiparallel, the resistance of the element is high. In order to sense the resistance of the magnetic element, current is driven through the magnetic element, either as current in plane ("CIP") or current perpendicular to the plane ("CPP").

A typically memory array is formed from a plurality of memory cells, each which has a magnetic memory element and a select device such as transistor. In order to write to a conventional memory cell, a write current is applied to a bit line while a read current is not applied. In addition, a write line carries a current to write to the selected memory cell. The combination of the current in the write line and the current in the bit line generates a magnetic field large enough to switch the direction or orientation of magnetization of the free layer of the magnetic element and thus write to the desired conventional memory cell. Depending upon the data written to the memory cell, the element, e.g., magnetic tunneling junction, will have a high resistance or a low resistance. To read from the memory cell, a read current is applied instead and the output voltage across the cell is read.

Although the conventional magnetic memory using the conventional spin tunneling junctions can function adequately, there are barriers to the use of the conventional magnetic elements and the conventional magnetic memory at higher memory cell densities. For example, a conventional memory array is written using an external magnetic field generated by currents driven through the bit line and the write line. Thus, the magnetization orientation of the free layer is switched by the external magnetic field generated by the current driven through the bit line and the write line. The magnetic field required to switch the magnetization orientation of the free layer, known as the switching field, is inversely proportional to the width of the magnetic element. As a result, the switching field increases with smaller magnetic elements. Because the switching field is higher, the current required increases. This large current can cause various problems. For example, cross talk and power consumption increases. The driving circuits required to drive the current that generates the switching field increases in area and complexity. Additionally, the write currents have to be large enough to switch a magnetic memory cell but not so large that the neighboring cells are inadvertently switched. This upper limit on the write current can lead to writeability issues because the cells that are harder to switch than others (due to fabrication and material nonuniformity) may fail to write consistently.

What is needed are magnetic memory elements which can be used in a memory array of high density, low power consumption, low cross talk, and high reliability, while providing sufficient read signal. The present disclosure provides such improved magnetic memory elements.

BRIEF SUMMARY

The present disclosure relates to spin torque magnetic memory elements having a pinned layer and two free layers. Memory elements of this disclosure include a current-blocking insulating layer proximate to at least one of the free layers. Additionally, the resistive state (e.g., low resistance or high resistance) of the memory cells or memory elements of this disclosure is altered by passing electric current through the element in one direction. In other words, to change from a low resistance to a high resistance, the direction of electric current is the same as to change from a high resistance to a low resistance. The elements have a unidirectional write scheme.

A first particular embodiment of this disclosure is to a magnetic element having a first ferromagnetic free layer having a magnetization orientation, a second ferromagnetic free layer having a magnetization orientation, and a nonmagnetic metallic spacer layer therebetween. A current-blocking insulator layer having a via therethrough is also present. The magnetic element also includes a ferromagnetic pinned layer having a magnetization orientation pinned in a first direction and an insulative barrier layer between the pinned layer and the first free layer. The magnetic element is configured to allow the magnetization orientation of the second free layer to change direction due to spin torque when a write current is passed through the via in the current-blocking insulator layer. The magnetic element is also configured to allow the magnetization orientation of the first free layer to change direction due to interlayer coupling with the second free layer when the write current is removed. In some embodiments, prior to passing the write current through the via, the magnetization orientation of the second free layer is in the first direction and the magnetization orientation of the second free layer is in a second direction opposite to the first direction.

Another particular embodiment of this disclosure is to a magnetic element having a first ferromagnetic free layer having a magnetization orientation, a second ferromagnetic free layer having a magnetization orientation, and a nonmagnetic metallic spacer layer therebetween. The magnetic element includes a current-blocking insulator layer having a via therethrough. Also present is a ferromagnetic pinned layer having a magnetization orientation pinned in a first direction and an insulative barrier layer between the pinned layer and the first free layer. Prior to passing a write current through the magnetic element, the magnetization orientation of the first free layer is in the first direction and the magnetization orientation of the second free layer is in a second direction opposite to the first direction, but after passing a write current through the magnetic element, the magnetization orientation of the second free layer is in the first direction and the magnetization orientation of the first free layer is in the second direction.

In another particular embodiment, the magnetic element is configured to allow the magnetization orientation of the second free layer to change direction due to spin torque when a write current greater than a critical current is passed through the via in the current-blocking insulator layer, and to allow the magnetization orientation of the first free layer to change direction due to interlayer coupling with the second free layer. Removal of the write current changes the magnetization orientation.

Another particular embodiment of this disclosure is a method of altering the resistance of a memory cell or memory element. This method includes providing a magnetic element having a low resistance, the magnetic element comprising a first ferromagnetic free layer, a second ferromagnetic free layer, and a nonmagnetic metallic spacer layer therebetween, a current-blocking insulator layer between the first free layer and the second free layer, the current-blocking insulator having a via therethrough, a ferromagnetic pinned layer, and an insulative barrier layer between the pinned layer and the first free layer. The magnetization orientation of the second free layer is switched by passing a current in the second free layer through the via into the first free layer and the pinned layer, and the magnetization orientation of the first free layer is switched by removing the current from the second free layer. Thus is obtained a high resistance across the magnetic element. To switch the resistance back to a low resistance, the magnetization orientation of the second free layer is switched by passing a current in the second free layer through the via into the first free layer and the pinned layer, and switching the magnetization orientation of the first free layer by removing the current from the second free layer.

These and various other features and advantages will be apparent from the following detailed description.

BRIEF DESCRIPTION OF THE DRAWINGS

The invention may be more completely understood in consideration of the following detailed description of various embodiments of the invention in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present invention. The following detailed description, therefore, is not to be taken in a limiting sense. While the present invention is not so limited, an appreciation of various aspects of the invention will be gained through a discussion of the examples provided below.

Figure 1:
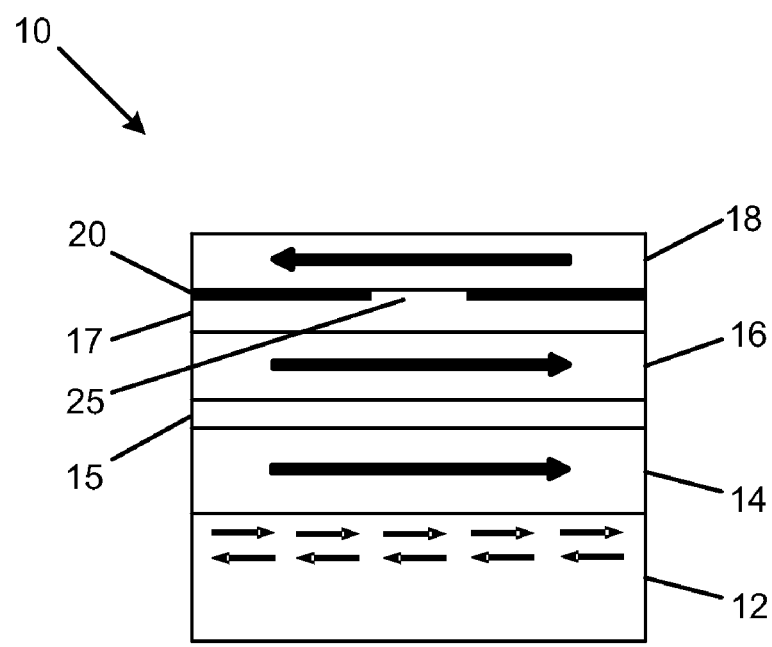
FIG. 1 is a schematic diagram of a first embodiment of a memory element according to the present disclosure.

Referring to FIG. 1, an embodiment of a magnetic memory element 10 in accordance with the present disclosure is schematically and diagrammatically illustrated. Although magnetic memory element 10 is illustrated as two dimensional, it should be understood that memory element 10 and others according to this disclosure are three-dimensional 'stacks' or 'towers', for example, having a circular, elliptical, or rectangular (e.g., square) shape when viewed from the top. Although not illustrated herein, memory element 10 may be formed on a substrate, and may be electrically connected to a bit line and a word line. Memory element 10 and other memory elements may include additional layers, such as seed or capping layers, not depicted herein for clarity.

Memory element 10 includes an antiferromagnetic pinning layer 12, a ferromagnetic pinned layer 14, a first ferromagnetic free layer 16 and a second ferromagnetic free layer 18. Each of these layers, ferromagnetic pinned layer 14, first ferromagnetic free layer 16 and second ferromagnetic free layer 18, has a magnetic orientation or magnetization orientation associated therewith. Positioned between pinned layer 14 and first ferromagnetic free layer 16 is a barrier layer 15. Additionally, positioned between first ferromagnetic free layer 16 and second ferromagnetic free layer 18 is a nonmagnetic (metallic) spacer layer 17. Memory element 10 and its various layers (e.g., pinning layer 12, pinned layer 14, barrier layer 15, free layers 16, 18, etc.) can be made by conventional thin film processing techniques, including lithography or vapor deposition.

Memory element 10 can be considered to have a first magnetic element and a second magnetic element in series. The first element could be considered to include antiferromagnetic pinning layer 12, pinned ferromagnetic layer 14, first ferromagnetic free layer 16, and barrier layer 15. Barrier layer 15 allows electrons to tunnel therethrough between pinned layer 14 and free layer 16. The second element could be considered to include the first ferromagnetic layer 16, second ferromagnetic layer 18, and nonmagnetic spacer 17. In accordance with the invention of this disclosure, it is the first magnetic element that contributes the majority of the resistance across cell 10.

Magnetic memory elements of this disclosure include a current-blocking insulating layer proximate the exposed free layer. For memory element 10, positioned between metallic spacer 17 and second free layer 18 is an insulator layer 20 having a via 25 therein. Insulator layer 20 and other current-blocking layers can be made by conventional thin film processing techniques, including lithography or vapor deposition. Insulator layer 20 is insulative or blocking to electrons (i.e., current) passing therethrough. Current, or electrons, which would pass through the magnetic element in a CPP configuration, can only pass through via 25 in insulator layer 20. Via 25 may be circular, elliptical, or have any other suitable shape defined by insulator layer 20, or via 25 may extend from one edge of insulator layer 20 to the other, thus forming at least two separate and distinct parts of layer 20.

FIGS. 2A through 2D illustrate the altering of the magnetization orientation of the free layers 16, 18 in memory element 10 when a current is applied. This altering of the magnetization orientation switches the resistance state of memory element 10, for example, from a first resistance state (e.g., a low resistance state ($R_L$)) to a second resistance state (e.g., a high resistance state ($R_H$)).

The assumption is made that free layers 16, 18 are antiferromagnetically coupled to each other, and that the coercivity of second free layer 18 and the interlayer coupling field are larger than the coercivity of first free layer 16.

Since the magnetic tunneling junction contributes the majority of the resistance across cell 10 and the magnetoresistance ratio of the cell, the resistance of the cell is determined, in large part, by the magnetization orientation of first free layer 16 and pinned layer 14. Because pinned layer 14 has its magnetization orientation fixed, change in the magnetization orientation of first free layer 16 will change the resistance and the logic bit state of memory element 10.

FIG. 1 illustrates memory element 10 at an initial, equilibrium state, with no electric current having been passed through. First free layer 16 is parallel to pinned layer 14, and first free layer 16 is antiparallel to second free layer 18. In this configuration, cell 10 is at first resistance state (e.g., a low resistance state ($R_L$)), due to the parallel magnetization orientation of pinned layer 14 and first free layer 16.

Figure 2A:
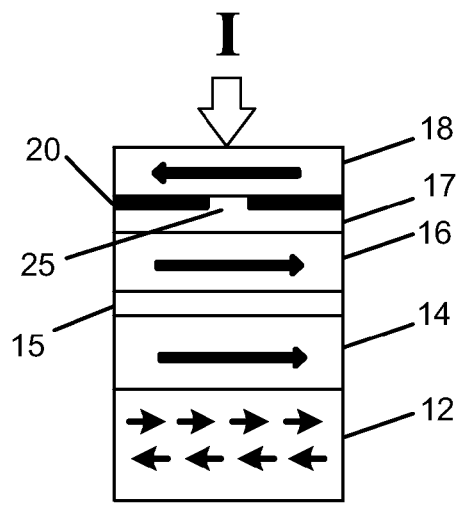
FIGS. 2A through 2D are schematic diagrams of a memory element according to the present disclosure during a write process having the current pass through in a first direction.

To switch the magnetization orientation of second free layer 18 using spin transfer, an electric current "I" is applied from second free layer 18 to first free layer 16 and through cell 10; see FIG. 2A. This current is driven from second free layer 18 through via 25 to first free layer 16 to pinned layer 14.

When current is driven from second free layer 18 through first free layer 16 to pinned layer 14, conduction electrons travel the reverse direction from pinned layer 14 to first free layer 16 to second free layer 18. The majority of electrons traveling from pinned layer 14 have their spins polarized in the same direction as the magnetization orientation of pinned layer 14. These electrons interact with the magnetic moments of second free layer 18 near the interface between second free layer 18 and the spacer layer 17. As a result of this interaction, the electrons transfer their spin angular momentum to second free layer 18. Thus, angular momentum corresponding to spins antiparallel to the magnetization orientation of second free layer 18 (and parallel to pinned layer 14 and to first free layer 16) is transferred to second free layer 18. When sufficient angular momentum is transferred by the electrons, the magnetization orientation of second free layer 18 is switched to be parallel to the magnetization orientation of pinned layer 14 and first free layer 16. This magnetization orientation dynamics occurs in second free layer 18 via exchange coupling.

Memory element 10, however, includes insulator layer 20 between first free layer 16 and second free layer 18 which does not allow current or electrons to pass therethrough except through via 25. The electron density and thus the spin torque within second free layer 18 are highest proximate via 25. Consequently, the magnetization orientation of second free layer 18 proximate via 25 switches before other areas of second free layer 18. See FIG. 2B.

After the area of second free layer 18 proximate via 25 has switched, the magnetization orientation of the entire second free layer 18 switches. After this switch, second free layer 18 is parallel with first free layer 16; see FIG. 2C. After the current is removed (FIG. 2C) to end the write process, the parallel configuration of first free layer 16 in relation to second free layer 18 is not energetically favored, and the interlayer coupling forces the first free layer 16 magnetization orientation to switch, resulting in an antiparallel orientation (FIG. 2D). At this configuration, memory element 10 is at a second resistance state (e.g., a high resistance state ($R_H$)), due to the due to the antiparallel magnetization orientation of pinned layer 14 and first free layer 16.

Figure 2B:
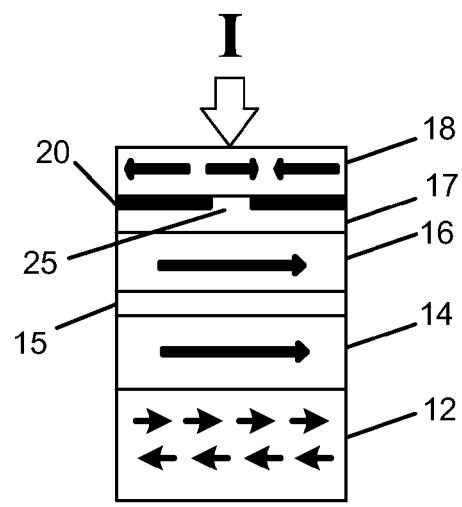
Figure 2C:
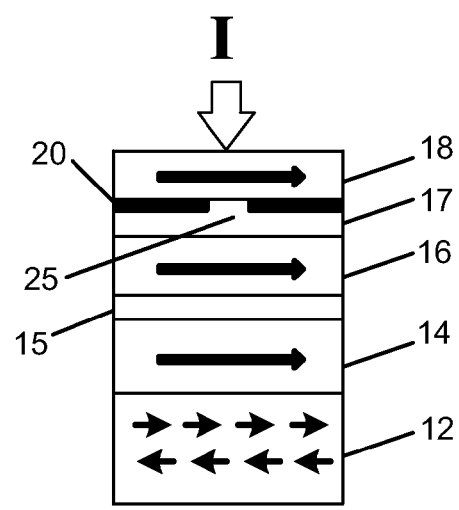
Figure 2D:
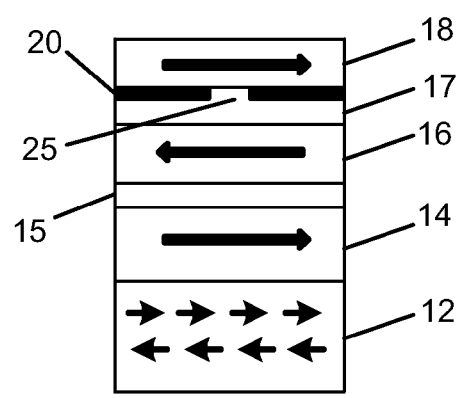
Figure 2E:
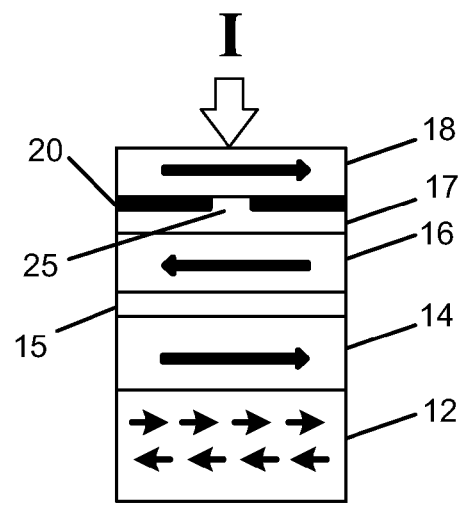
FIGS. 2E through 2H are schematic diagrams of the memory element during a second write process having the current pass through in the same direction.
Figure 2F:
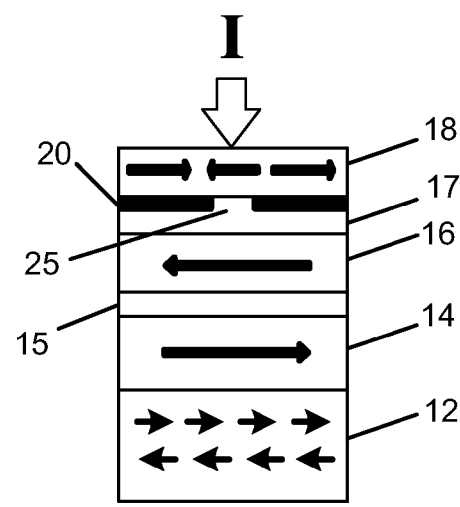
Figure 2G:
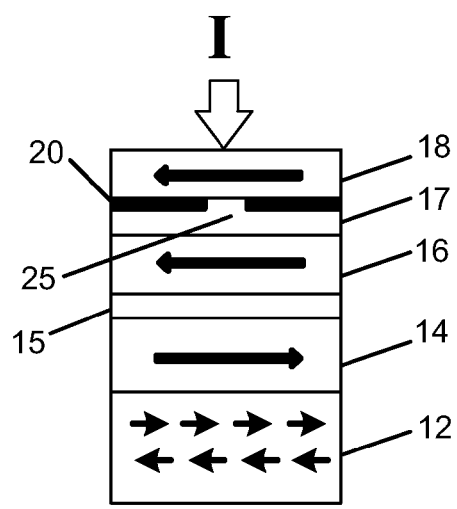
Figure 2H:
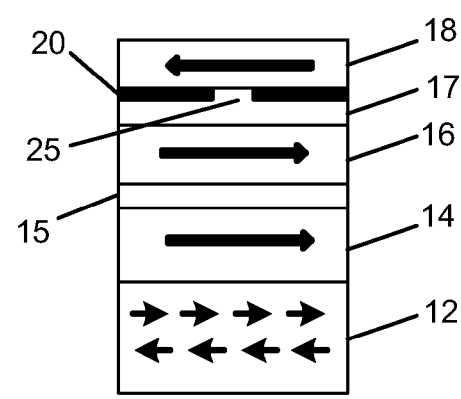

As seen in FIGS. 2A through 2C, the magnetization orientation of first free layer 16 does not switch due to the application of current "I". This is due to the limited passage between first free layer 16 to second free layer 18, i.e., via 25. Due to the presence of insulator layer 20, the current fans out from via 25 into first free layer 16, resulting in a current density passing through first free layer 16 that is lower than the critical current density for switching first free layer 16.

To switch memory element 10 back a low resistance state ($R_L$), an electric current is applied in the same direction as the write current that switched the resistance to the high state ($R_H$); see FIGS. 2E through 2H. The magnetization orientations of first free layer 16 and second free layer 18 will experience similar dynamics as when the write current was applied. The magnetization orientation of first free layer 16 and second free layer 18 will switch back to their initial direction, in essentially the same manner as described above.

For the memory elements in accordance with this disclosure, the write current is applied in a single direction. Free layers 16, 18 change their magnetization orientations regardless the initial state. Therefore, prior to writing data in magnetic memory element 10, its state should be confirmed by a read operation to determine whether or not a write operation is needed to change the state of the magnetic memory element. In some embodiments, the read operation is also called pre-read operation.

The discussion above has been for a "write" operation, providing memory element 10 with either a low resistance state ($R_L$) or a high resistance state ($R_H$), which correlates with either a "0" or "1". To "read" memory element 10, a current is applied through the stack structure and the resistance of cell 10 is measured. This read current is smaller than the write current, in order to not alter the resistance of cell 10.

Various alternative configurations for memory elements having a current-blocking insulating layer proximate the exposed free layer are illustrated in FIGS. 3 through 7. The various layers of the memory elements of FIGS. 3 through 7 have the same properties and qualities as the respective layers of memory element 10, unless otherwise indicated.

Figure 3:
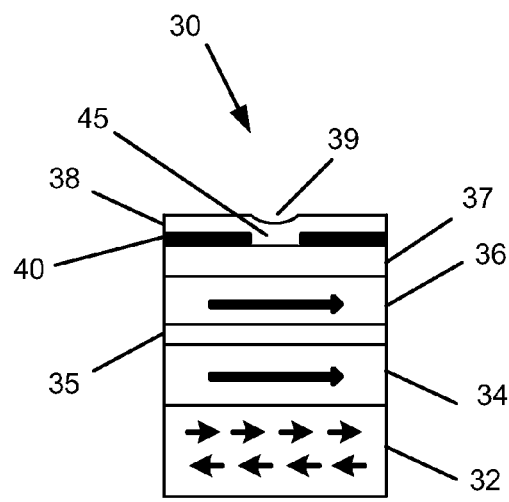
FIG. 3 is a schematic diagram of a second embodiment of a memory element according to the present disclosure.

FIG. 3 illustrates a memory element 30 having an antiferromagnetic pinning layer 32, a ferromagnetic pinned layer 34, a first ferromagnetic free layer 36 and a second ferromagnetic free layer 38. Each of these layers, ferromagnetic pinned layer 34, first ferromagnetic free layer 36 and second ferromagnetic free layer 38, has a magnetic orientation or magnetization orientation associated therewith; for clarity in the figure, the magnetization orientation of second free layer 38 is not illustrated. Positioned between pinned layer 34 and first free layer 36 is a barrier layer 35. Additionally, positioned between first free layer 36 and second free layer 38 is a nonmagnetic (metallic) spacer layer 37. Positioned between metallic spacer 37 and second free layer 38 is an insulator layer 40 having a via 45 therein. In memory element 30, via 45 in insulator layer 40 has material from second free layer 38 therein, whereas in memory element 10, via 25 in insulator layer 20 has material from metallic spacer 17 therein.

In cell 30, a portion of second free layer 38 is occupies the volume of via 45, the top surface of free layer 38 includes a depression 39 therein. Such a depression 39 forms during the manufacturing process of cell 30, when material from free layer 38 fills in via 45. Because of depression 39 in second free layer 38, the exchange coupling between magnetic moments is weak at that region. Because of this, the write current density to switch the center part of second free layer 38 is lower since the exchange coupling of the magnetic moments influences the write current density. After the portion of free layer 38 proximate via 45 (e.g., the center part) is switched, the remainder of second free layer 38 will be switched by the exchange coupling.

Because of the limited passage area between first free layer 36 to second free layer 38, due to the present of insulator layer 40, which does not allow electrons to pass therethrough except through via 45, the current fans out from via 45 into first free layer 36 so that the density of the current passing through first free layer 36 is lower than the critical current density for switching first free layer 36. The current density and thus the spin torque within second free layer 38 are highest proximate via 45. Consequently, the magnetization orientation of second free layer 38 proximate via 45 switches before other areas of second free layer 38.

Figure 4:
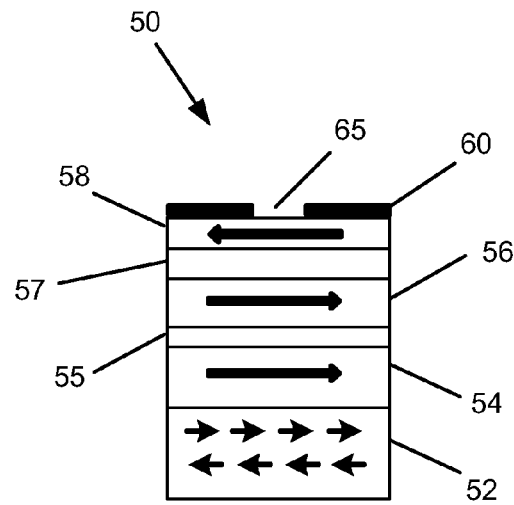
FIG. 4 is a schematic diagram of a third embodiment of a memory element according to the present disclosure.

Another embodiment is illustrated in FIG. 4 where a memory element 50 includes an antiferromagnetic pinning layer 52, a ferromagnetic pinned layer 54, a first ferromagnetic free layer 56 and a second ferromagnetic free layer 58. Positioned between pinned layer 54 and first free layer 56 is a barrier layer 55. Additionally, positioned between first free layer 56 and second free layer 58 is a nonmagnetic (metallic) spacer layer 57. Positioned adjacent second free layer 58 is an insulator layer 60 having a via 65 therein.

In this embodiment, because of the limited passage area into second free layer 58 for a write current, due to the present of insulator layer 60 that does not allow electrons to pass therethrough except through via 65, the current fans out from via 65 into second free layer 58 so that the density of the current passing through second free layer 58 is lower than the critical current density for switching second free layer 58. The current density and thus the spin torque within second free layer 58 are highest proximate via 68. Consequently, the magnetization orientation of second free layer 58 proximate via 65 switches before other areas of second free layer 58.

Figure 5:
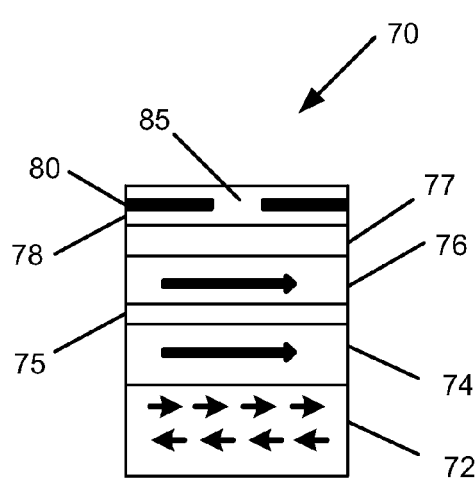
FIG. 5 is a schematic diagram of a fourth embodiment of a memory element according to the present disclosure.

A third alternative embodiment is illustrated in FIG. 5 as a memory element 70 that includes an antiferromagnetic pinning layer 72, a ferromagnetic pinned layer 74, a first ferromagnetic free layer 76 and a second ferromagnetic free layer 78. Positioned between pinned layer 74 and first free layer 76 is a barrier layer 75 and positioned between first free layer 76 and second ferromagnetic free layer 78 is a nonmagnetic (metallic) spacer layer 77. Present within second free layer 78 is an insulator layer 80 having a via 85 therein.

Similar to memory elements 10, 30, because of the limited passage area between first free layer 76 and second free layer 78 for a current to pass through, the current fans out from via 85 into second free layer 88 so that the current density and spin torque within second free layer 78 are highest proximate via 85. Consequently, the magnetization orientation of second free layer 78 proximate via 85 switches before other areas of second free layer 78.

Figure 6:
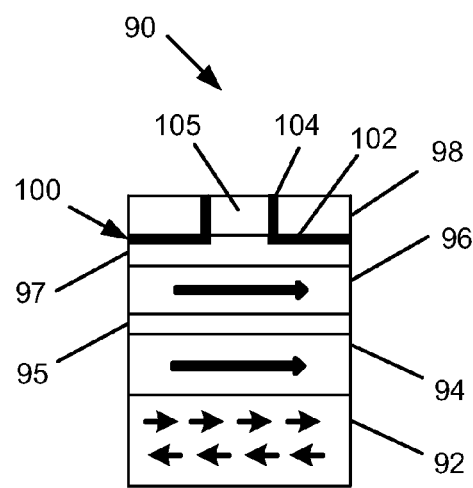
FIG. 6 is a schematic diagram of a fifth embodiment of a memory element according to the present disclosure.

FIG. 6 illustrates a memory element 90 having an antiferromagnetic pinning layer 92, a ferromagnetic pinned layer 94, a first ferromagnetic free layer 96 and a second ferromagnetic free layer 98. Positioned between pinned layer 94 and first free layer 96 is a barrier layer 95 and positioned between first free layer 96 and second free layer 98 is a nonmagnetic (metallic) spacer layer 97. Memory element 90 includes an insulator layer 100, a portion 102 of which is positioned between spacer layer 97 and second free layer 98. In this embodiment, another portion 104 of insulator layer 100 extends through second free layer 98, from spacer layer 97 to an exposed top surface of memory element 90. Portion 104 defines a passage or via 105 within second free layer 98. If viewed from the top, one would see that second free layer 98 has a continuous (e.g., annular) perimeter region and a central core (i.e., via 105) defined by portion 104 of insulator layer 100. The central core may be circular, elliptical, or other suitable shape.

Figure 7:
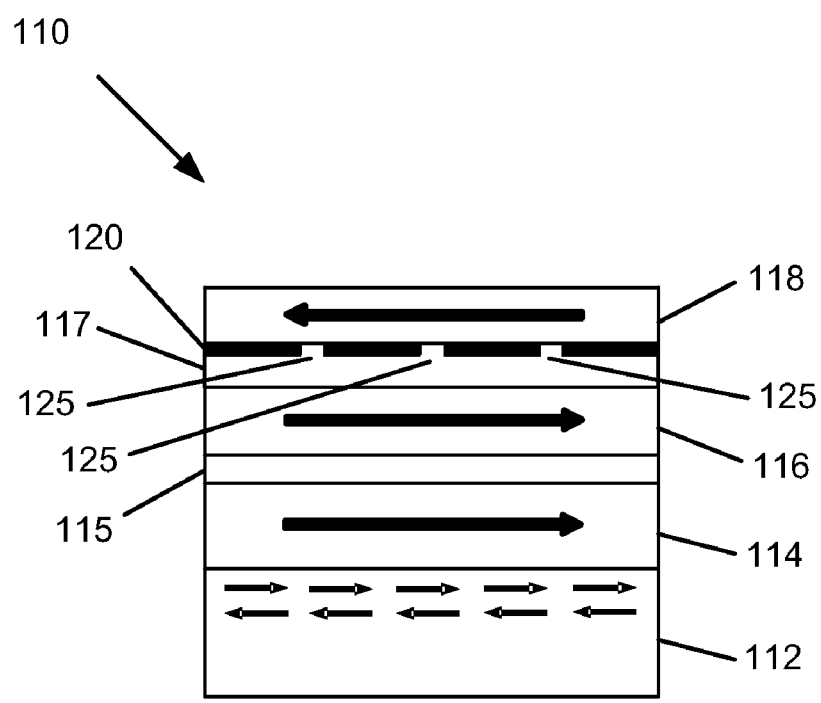
FIG. 7 is a schematic diagram of a sixth embodiment of a memory element according to the present disclosure, this embodiment having multiple vias.

The previous embodiments have had a single via through the insulative layer. Also within the scope of this disclosure are memory elements having more than one via in the insulative layer through which the current and electrons can pass. Referring to FIG. 7, a memory element 110 is illustrated having three vias through the insulative layer. Specifically, memory element 110 has an antiferromagnetic pinning layer 112, a ferromagnetic pinned layer 114, a first ferromagnetic free layer 116 and a second ferromagnetic free layer 118. Positioned between pinned layer 114 and first free layer 116 is a barrier layer 115 and positioned between first free layer 116 and second free layer 118 is a nonmagnetic (metallic) spacer layer 117. An insulator layer 120 is positioned between spacer layer 117 and second free layer 118, similar to the position of insulator layer 20 in memory element 10. Insulator layer 120 has a plurality of vias 125 therethrough; in this particular embodiment, three vias 125.

For this memory element 110, current fans out from the three vias 125 into first free layer 116. Depending on the dimensions of vias 125 and distance between them, the current through a first via 125 may overlap with the current through a neighboring via 125. Because the magnetization orientation of second free layer 118 proximate vias 125 switches before other areas of second free layer 118, three areas of free layer 118 will typically switch before the other four areas.

Thus, numerous embodiments of the SPIN-TORQUE MEMORY WITH UNIDIRECTIONAL WRITE SCHEME are disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A magnetic element comprising:
    a first ferromagnetic free layer having a magnetization orientation, a second ferromagnetic free layer having a magnetization orientation, and a nonmagnetic metallic spacer layer therebetween;
    a ferromagnetic pinned layer having a magnetization orientation pinned in a first direction;
    an insulative barrier layer between the pinned layer and the first free layer;
    a current-blocking insulator layer proximate the second free layer, the current-blocking insulator having a via therethrough;
    wherein the magnetic element is configured to allow the magnetization orientation of the second free layer to change direction due to spin torque when a write current is passed through the via in the current-blocking insulator layer, and
    wherein the magnetic element is configured to allow the magnetization orientation of the first free layer to change direction due to spin torque when the write current is removed.

2. The magnetic element of claim 1 wherein prior to passing the write current through the via, the magnetization orientation of the second free layer is in the first direction and the magnetization orientation of the second free layer is in a second direction opposite to the first direction.

3. The magnetic element of claim 1 further comprising a pinning layer on a side of the pinned layer opposite the barrier layer.

4. The magnetic element of claim 1 wherein the current-blocking insulator layer is between the first free layer and the second free layer.

5. The magnetic element of claim 4 wherein the current-blocking insulator layer is between the metallic spacer layer and the second free layer.

6. The magnetic element of claim 5, wherein the metallic spacer layer extends into the via.

7. The magnetic element of claim 5, wherein the second free layer extends into the via.

8. The magnetic element of claim 1, wherein the current-blocking insulator layer is within the second free layer.

9. The magnetic element of claim 1, wherein the current-blocking insulator layer is on a surface of the second free layer opposite the metallic spacer layer.

10. The magnetic element of claim 1, wherein the current-blocking insulator layer defines a perimeter region around the via.

11. The magnetic element of claim 1, wherein the current-blocking insulating layer comprises a plurality of vias therethrough.

12. The magnetic element of claim 1, further wherein:
the magnetic element is configured to allow the magnetization orientation of the second free layer to change direction due to spin torque when a second write current is passed through the via in the same direction as the first write current after the first write current, and
the magnetic element is configured to allow the magnetization orientation of the first free layer to change direction due to spin torque when the second write current is removed.

13. A magnetic element comprising:
a first ferromagnetic free layer having a magnetization orientation, a second ferromagnetic free layer having a magnetization orientation, and a nonmagnetic metallic spacer layer therebetween;
a ferromagnetic pinned layer having a magnetization orientation pinned in a first direction; and
an insulative barrier layer between the pinned layer and the first free layer;
a current-blocking insulator layer proximate the second free layer, the current-blocking insulator having a via therethrough;
wherein prior to passing a write current through the magnetic element, the magnetization orientation of the first free layer is in the first direction and the magnetization orientation of the second free layer is in a second direction opposite to the first direction, and
wherein after passing a write current through the magnetic element, the magnetization orientation of the second free layer is in the first direction and the magnetization orientation of the first free layer is in the second direction.

14. The magnetic element of claim 13 wherein the current-blocking insulator layer is between the first free layer and the second free layer.

15. The magnetic element of claim 14 wherein the current-blocking insulator layer is between the metallic spacer layer and the second free layer.

16. The magnetic element of claim 13, wherein the current-blocking insulator layer is within the second free layer.

17. The magnetic element of claim 13, wherein the current-blocking insulator layer is on a surface of the second free layer opposite the metallic spacer layer.

18. The magnetic element of claim 13, wherein the current-blocking insulator layer defines a perimeter region around the via.

19. The magnetic element of claim 13, wherein the current-blocking insulating layer comprises a plurality of vias therethrough.

20. The magnetic element of claim 13, further wherein:
prior to passing a second write current through the magnetic element, the magnetization orientation of the first free layer is in the second direction and the magnetization orientation of the second free layer is in first direction, and
wherein after passing the second write current through the magnetic element in the same direction as the first write current, the magnetization orientation of the second free layer is in the second direction and the magnetization orientation of the first free layer is in the first direction.

21. A method of altering a resistance of a memory cell comprising:
providing a magnetic element having a low resistance, the magnetic element comprising:
a first ferromagnetic free layer having a magnetization orientation, a second ferromagnetic free layer having a magnetization orientation, and a nonmagnetic metallic spacer layer therebetween;
a ferromagnetic pinned layer having a magnetization orientation pinned in a first direction;
an insulative barrier layer between the pinned layer and the first free layer; and
a current-blocking insulator layer proximate the second free layer, the current-blocking insulator having a via therethrough;
switching the magnetization orientation of the second free layer by passing a current in the second free layer through the via into the first free layer and the pinned layer; and
switching the magnetization orientation of the first free layer by removing the current from the second free layer, and obtaining a high resistance across the magnetic element.

22. The method of claim 21 further including altering the high resistance across the magnetic element to a low resistance by:
switching the magnetization orientation of the second free layer by passing a current in the second free layer through the via into the first free layer and the pinned layer; and
switching the magnetization orientation of the first free layer by removing the current from the second free layer, and obtaining a low resistance across the magnetic element.

* * * * *